(12) United States Patent
Shen et al.

(10) Patent No.: US 11,626,182 B2
(45) Date of Patent: Apr. 11, 2023

(54) SELECTIVE POWER-ON SCRUB OF MEMORY UNITS

(71) Applicant: Micron Technology, Inc., Boise, ID (US)

(72) Inventors: Zhenlei Shen, Milpitas, CA (US); Tingjun Xie, Milpitas, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/394,232

(22) Filed: Aug. 4, 2021

(65) Prior Publication Data

US 2023/0044318 A1     Feb. 9, 2023

(51) Int. Cl.
    *G11C 29/00*     (2006.01)
    *G11C 29/42*     (2006.01)
    *G06F 11/10*     (2006.01)
    *G06F 3/06*     (2006.01)
    *G11C 13/00*     (2006.01)
    *G11C 29/04*     (2006.01)

(52) U.S. Cl.
CPC ............ *G11C 29/42* (2013.01); *G06F 3/0619* (2013.01); *G06F 3/0659* (2013.01); *G06F 3/0679* (2013.01); *G06F 11/1068* (2013.01); *G11C 13/004* (2013.01); *G11C 13/0069* (2013.01); *G11C 2029/0407* (2013.01)

(58) Field of Classification Search
CPC ... G11C 29/42; G11C 13/004; G11C 13/0069; G11C 2029/0407; G06F 11/1068; G06F 3/0619; G06F 3/0679; G06F 3/0659
See application file for complete search history.

(56) References Cited

U.S. PATENT DOCUMENTS

| | | | |
|---|---|---|---|
| 2015/0058535 A1* | 2/2015 | Lasser | G11C 16/3495 711/103 |
| 2018/0129575 A1 | 5/2018 | Dallabora | |
| 2020/0034230 A1 | 1/2020 | Jeyapaul et al. | |
| 2021/0149800 A1 | 5/2021 | Yang | |
| 2021/0208988 A1 | 7/2021 | Dallabora | |
| 2022/0139454 A1* | 5/2022 | Robertson | G11C 16/3431 365/148 |

FOREIGN PATENT DOCUMENTS

KR     1020180020706 A     2/2018

OTHER PUBLICATIONS

International Search Report and Written Opinion for International application No. PCT/US2022/039332 dated Nov. 24, 2022, 9 pages.

* cited by examiner

*Primary Examiner* — Samir W Rizk
(74) *Attorney, Agent, or Firm* — Lowenstein Sandler LLP

(57) ABSTRACT

A system includes a memory device storing groups of managed units and a processing device operatively coupled to the memory device. The processing device is to, during power on of the memory device, perform including: causing a read operation to be performed at a subset of a group of managed units; determining a bit error rate related to data read from the subset of the group of managed units; and in response to the bit error rate satisfying a threshold criterion, causing a rewrite of the data stored at the group of managed units.

17 Claims, 5 Drawing Sheets

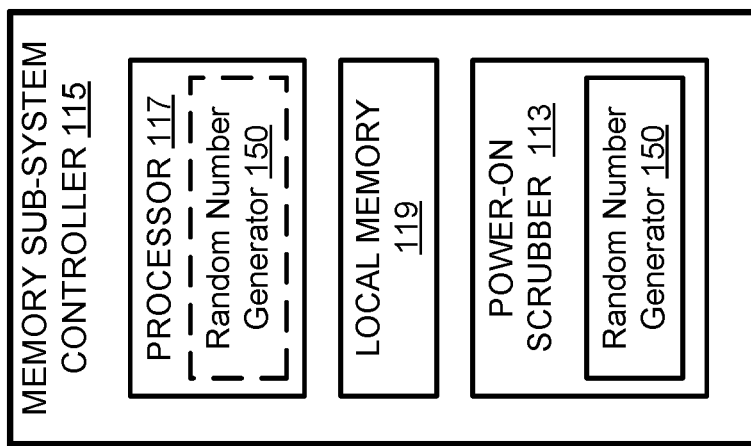

SELECTIVE POWER-ON SCRUB OF MEMORY UNITS

TECHNICAL FIELD

Embodiments of the disclosure relate generally to memory sub-systems, and more specifically, relate to selective power-on scrub of memory units.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 1B is a block diagram of the memory sub-system controller 115 of the example computing environment of FIG. 1A according to an embodiment.

DETAILED DESCRIPTION

Figure 1A:
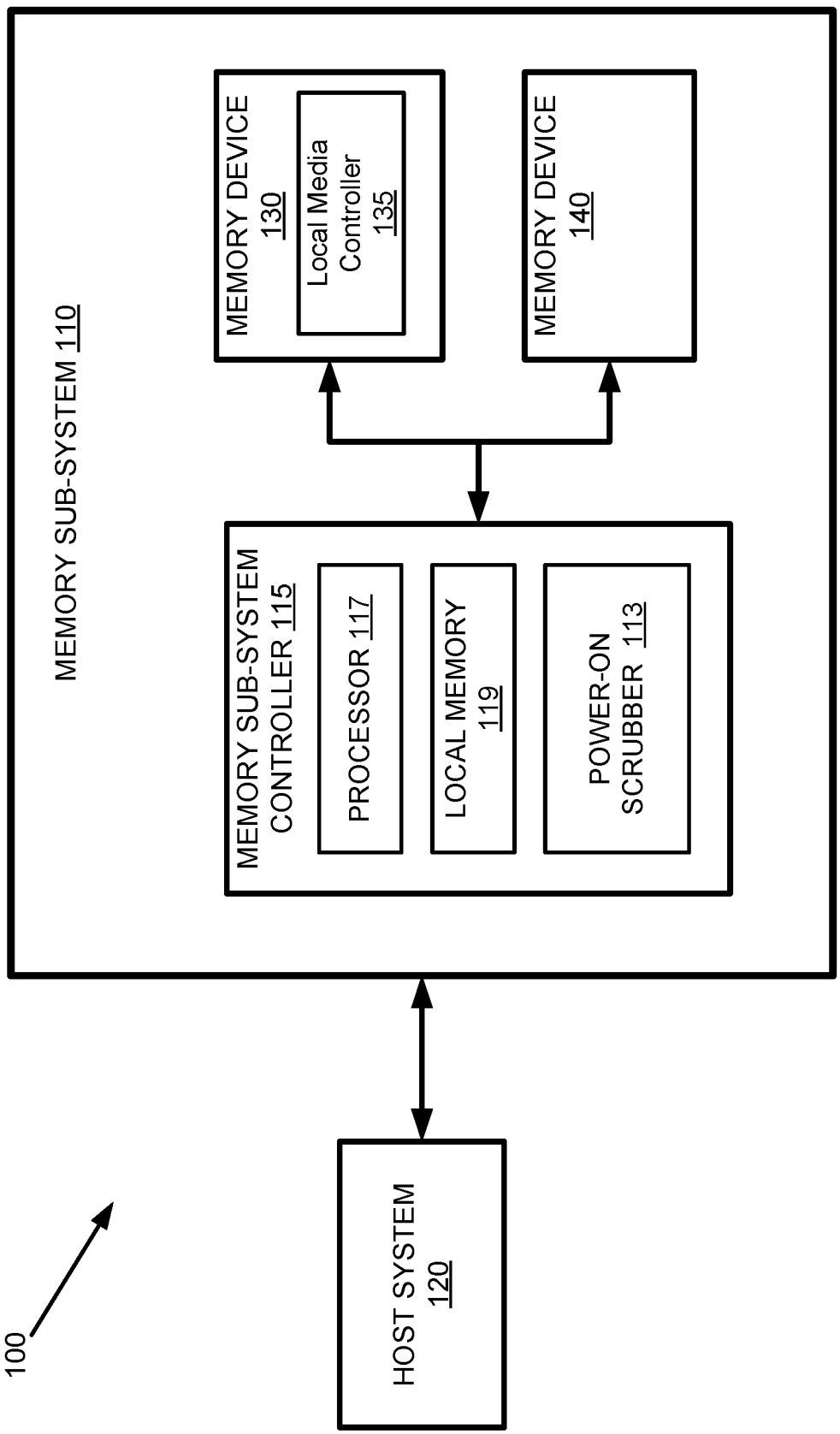
FIG. 1A illustrates an example computing environment that includes a memory sub-system in accordance with some embodiments.

Aspects of the present disclosure are directed to a selective power-on scrub of memory units. A memory sub-system can be a storage device, a memory module, or a hybrid of a storage device and memory module. Examples of storage devices and memory modules are described below in conjunction with FIG. 1A. In general, a host system can utilize a memory sub-system that includes one or more memory components, such as memory devices that store data. The host system can provide data to be stored at the memory sub-system and can request data to be retrieved from the memory sub-system.

The memory components can include non-volatile memory devices that store data from the host system. A non-volatile memory device is a package of one or more dice. The dice in the packages can be assigned to one or more channels for communicating with a memory sub-system controller. The non-volatile memory devices include cells (i.e., electronic circuits that store information), that are grouped into pages to store bits of data. The non-volatile memory devices can include three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1A.

Three-dimensional (3D) cross-point memory devices can group pages across dice and channels to form managed units (MUs). An MU can include user data and corresponding metadata. A memory sub-system controller can send and receive user data and corresponding metadata as managed units to and from memory devices. A super managed unit (SMU) is a group of one or more MUs that are managed together. For example, a memory sub-system controller can perform media management operations (e.g., wear level operations, refresh operations, etc.) on SMUs. Other examples of media management operations include garbage collection and scrub operations, the latter of which is the subject of this disclosure. In some memory devices, such as NAND memory devices, the SMUs can be understood to include one or more physical blocks or one or more super blocks (addressed by logical block address) that are managed together while the MUs can each include one or more pages that are transferred or programmed together.

A memory cell (or "cell") is an electronic circuit that stores information. Depending on the cell type, a cell can store one or more bits of binary information, and has various logic states that correlate to the number of bits being stored. The logic states can be represented by binary values, such as "0" (or a reset state) and "1" (or a set state), or combinations of such values. The various logic states have corresponding threshold voltage levels. A threshold voltage (Vt) is the voltage applied to the cell circuitry (e.g., control gate at which a transistor becomes conductive) to set the state of the cell. A cell is set to one of its logic states based on the Vt that is applied to the cell. For example, if a high Vt is applied to an SLC, a charge will be present in the cell, setting the SLC to store a logic 0. If a low Vt is applied to the SLC, charge will be absent in the cell, setting the SLC to store a logic 1.

The demarcation voltage (or voltage demarcation (VDM) level) can be a particular voltage that is applied to memory cells of a memory component to read the data stored at the memory cells. For example, if a threshold voltage (Vt) of a particular memory cell is identified as being below the demarcation voltage (e.g., VDM level) that is applied to the particular memory cell, then the data stored at the particular memory cell can be read as a particular value (e.g., a logical '1') or determined to be in a particular state (e.g., a set state). If the threshold voltage of the particular memory cell is identified as being above the demarcation voltage, then the data stored at the particular memory cell can be read as another value (e.g., a logical '0') or determined to be in another state (e.g., a reset state). Thus, the demarcation voltage can be applied to memory cells to determine values stored at the memory cells.

The threshold voltage or the threshold voltage distribution of multiple memory cells can shift or change over time, also referred to as voltage threshold drift. This drift in threshold voltage can be particularly pronounced when a memory device of the memory sub-system has been powered off for some period of time. When the threshold voltage of a memory cell changes, the application of the demarcation voltage can be inaccurate relative to the changed threshold voltage. For example, when the demarcation voltage is applied to the memory cell, the data stored at the memory cell can be misread or misinterpreted to be at a wrong value as compared to the value as originally stored when the threshold voltage had not yet shifted. In some situations, the memory device is powered off long enough that a read error occurs when attempting to read a memory cell (or a distribution of memory cells) using a set of inaccurate demarcation voltages relative to the drifted threshold voltage.

For these reasons, the memory sub-system controller causes the managed units of the memory device to be scrubbed to prevent these errors. Scrubbing is performed by re-writing the data in each managed unit, which involves first reading the data and then rewriting the data to reset the threshold voltage states in the memory cells of each managed unit. Even if the memory device has been powered off for a long time, some of the Vt states may still be adequate to avoid read errors while others are not, e.g., the Vt drift can be inconsistent across the managed units. Indiscriminately re-writing the managed units of the super managed units of a memory device (regardless of the amount of Vt drift while powered off) incurs a large performance penalty and long power-up time that reduces user experience. Further, power-up scrub jobs (e.g., to re-write the managed units) can be allocated with a relatively low priority compared to host operations, and thus take a longer time and extend the power-up transient period during which a memory sub-system will noticeably suffer in performance. Additionally, duplicating writes in a memory device can decrease the effective life of the memory device before the memory device becomes defective, e.g., reach an end-of-life event.

Aspects of the present disclosure address the above and other deficiencies by adapting a memory sub-system to perform a selective power-on scrub of each SMU (e.g., each group of managed units) that depends on a read bit error rate (RBER) (or a directional RBER) of a sampled subset of managed units of each super managed unit. More specifically, a memory sub-system controller (e.g., processing device) can, during a power on a memory device of the memory sub-system, perform a series of operations on each super managed unit to determine whether to completely scrub each SMU in turn.

In various embodiments, this series of operations can include causing a read operation to be performed at a subset of a group of managed units and determining a bit error rate related to the data read from the subset of the group of managed units. In at least one embodiment, in response to the bit error rate not satisfying a threshold criterion, the group of managed units is not scrubbed, e.g., the memory sub-system controller refrains from rewriting the data of the group of managed units. In this embodiment, in response to the bit error rate satisfying the threshold criterion, the memory sub-system controller rewrites the data stored at each managed unit of the group of managed units. The threshold criterion can be associated with a threshold bit error value or read failure count that, for a particular memory device or component, is considered to be in an unsafe state or unreliable.

In at least some embodiments, the subset of managed units that the memory sub-system controller samples in performing the read operation can be chosen randomly, pseudo-randomly, or by some other manner such that the subset can be considered representative of the managed units of the group of managed units. In this way, only if the RBER of the group of managed units, as sampled, meets the threshold criterion and thus justifies performing a power-on scrub, will a complete re-write of the SMU (group of managed units) be performed. As the scrub decision and the performance hit for performing the re-write is made for each SMU, the memory sub-system avoids indiscriminately re-writing the MUs of an entire memory device or component.

Advantages of the present disclosure include, but are not limited to improvement of power-up transient performance and lengthening the life of a memory device by avoiding unnecessary power-on scrubbing. For example, by selectively performing power-on scrub at the SMUs (or groups of managed units) of the memory device that satisfy a threshold criterion of RBER, the memory sub-system avoids indiscriminately performing a power-on scrub of the entire memory device and the incurring the corresponding performance penalties. As merely one example, if the sampling of each SMU samples about one percent of the memory device, the memory sub-system can reduce the number of read and write operations to at least a $1000^{th}$ fewer compared to the number of reads and writes performed in a complete scrub of the entire memory device or component. These and other advantages that would be apparent to those skilled in the art will be apparent from the following more detailed discussion.

FIG. 1A illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components, such as memory devices 130, when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type and NAND type memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells.

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA, namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a power-on scrubber 113 that can direct selective power-on scrubbing of the SMUs of the memory device 130, as described herein. In some embodiments, the memory sub-system controller 115 includes at least a portion of the power-on scrubber 113. For example, the memory sub-system controller 115 can include a processor 117 (processing device) configured to execute instructions stored in local memory 119 for performing the operations described herein. In some embodiments, the power-on scrubber 113 is part of the host system 110, an application, or an operating system.

FIG. 1B is a block diagram of the memory sub-system controller 115 of the example computing environment of FIG. 1A according to an embodiment. In some embodiments, the memory sub-system controller 115, discussed in detail with reference to FIG. 1A, further includes a random number generator 150, which is adapted to generate random numbers corresponding to addresses of the subset of the group of manage units that is sampled for determining the read bit error rate (RBER) of the group of manage units (or SMU). In this way, execution of the random number generator generates can, in some embodiments, also generate the addresses that are sampled to make up the subset of the group of managed units. In other embodiments, the random numbers generated by the random number generator 150 can be translated by the power-on scrubber 113 into the addresses for the subset of the group of managed units.

In various embodiments, the random number generator 150 can be executed directly by the power-on scrubber 113, or optionally, by the processor 117 on which the power-on scrubber 113 is also executed. Either way, the power-on scrubber 113 can access the random-numbered addresses generated by the random number generator 150 or can generate the random-numbered addressees by the numbers generated by the random number generator. Use of the numbers generated by the random number generator can enable selection of a representative sample of the managed units of each SMU.

Figure 2:
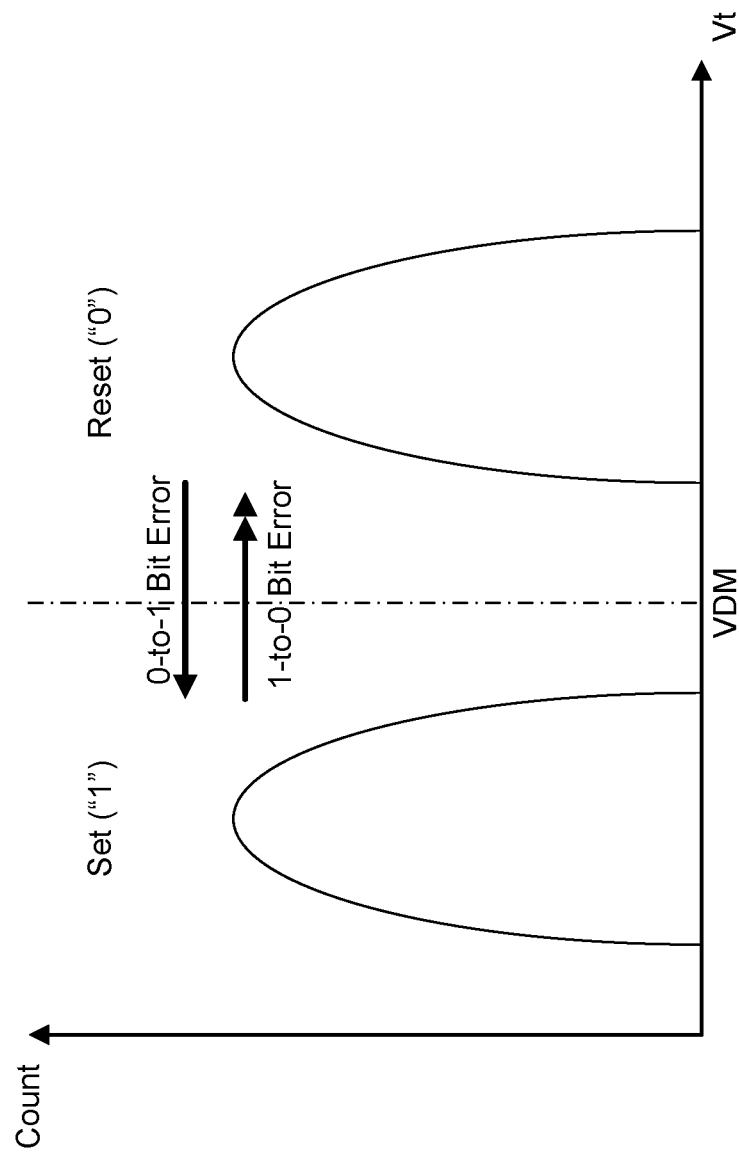
FIG. 2 is a graph illustrating directional bit error rate in accordance with some embodiments.

FIG. 2 is a graph illustrating directional bit error rate in accordance with some embodiments. The graph of FIG. 2 illustrates a distribution of logic states in a group of 3D cross-point memory cells, where the threshold voltage (Vt) is located along the x-axis and the cell count is located along the y-axis. The logic states can be represented by binary values, such as "0" (or a reset state) and "1" (or a set state), or combinations of such values. The various logic states have corresponding threshold voltage levels. The Vt is the voltage applied to the cell circuitry (e.g., control gate at which a transistor becomes conductive) to set the state of the cell. A cell is set to one of its logic states based on the Vt that is applied to the cell. For example, if a high Vt is applied to an SLC, a charge will be present in the cell, setting the SLC to store a logic 0. If a low Vt is applied to the SLC, charge will be absent in the cell, setting the SLC to store a logic 1.

The demarcation voltage (or voltage demarcation (VDM) level) can be a particular voltage that is applied to memory cells of a memory component to read the data stored at the memory cells. For example, if a Vt of a particular memory cell is identified as being below the demarcation voltage (e.g., VDM level) that is applied to the particular memory cell, then the data stored at the particular memory cell can be read as a particular value (e.g., a logical '1') or determined to be in a particular state (e.g., a set state). If the Vt of the particular memory cell is identified as being above the demarcation voltage, then the data stored at the particular memory cell can be read as another value (e.g., a logical '0') or determined to be in another state (e.g., a reset state). Thus, the demarcation voltage can be applied to memory cells to determine values (or logical values) stored at the memory cells.

In some embodiments, when the threshold voltage (Vt) of a memory cell changes (e.g. due to Vt drift discussed previously), the application of the demarcation voltage can be inaccurate relative to the changed threshold voltage. For example, when the demarcation voltage is applied to the memory cell, the data stored at the memory cell can be misread or misinterpreted to be at a wrong value as compared to the value as originally stored when the threshold voltage had not yet shifted. In at least some embodiments, as illustrated in the graph of FIG. 2, misinterpreted or misread data results in a directional bit error rate. The directional bit error rate can be understood as a rate of read errors resulting from an incorrectly determined state compared to a programmed state that transitions between two opposing logical states.

More specifically, in at least some embodiments, the directional bit error rate reflects the number of bits that are erroneously read as one logical state (e.g., "0") that is the opposite to another logical state (e.g., "1") in which the bits were programmed. The perceived transition from the "programmed" logical state to the "read" logical state can thus specify the direction associated with the measured bit error rate (e.g., 0-to-1 direction or 1-to-0 direction). Thus, for any given set of read operations, two directional bit error rates can be computed: the bit error rate associated with the perceived 0-to-1 transition ($RBER_{01}$) and the bit error rate associated with the perceived 1-to-0 transition ($RBER_{10}$). Accordingly, $RBER_{01}$ reflects the ratio of the number of programmed "0" bits which were erroneously read as "1" bits to the total number of "0" bits measured. Similarly, $RBER_{10}$ reflects the ratio of the number of programmed "1" bits which were erroneously read as "0" bits to the total number of "1" bits measured. In some implementations, directional failed bit counts, rather than the corresponding directional error rates, can be used.

Thus, in at least these embodiments with reference to FIG. 2, the directional bit error rate is directed in a particular threshold voltage direction that corresponds to one of the two directional bit error rates. More specifically, for a first directional error rate (e.g., $RBER_{01}$), the particular threshold voltage direction is in a direction of decreasing threshold voltage. Further, for a second directional error rate (e.g., $RBER_{10}$), the particular threshold voltage direction is in a direction of increasing threshold voltage.

In some embodiments, one directional error rate (e.g., $RBER_{10}$) may tend to exceed another directional error rate (e.g., $RBER_{01}$), where the double-headed arrow in FIG. 2 corresponds to the second directional bit error rate ($RBER_{10}$) to illustrate this tendency. This tendency to see a larger second directional error rate can be due to Vt drift generally being in an increasing Vt direction. For this reason, if the threshold criterion referred to herein corresponds to the first directional error rate, the threshold criterion can be set to a lower threshold RBER value. In contrast, if the threshold criterion referred to herein corresponds to the second directional error rate, the threshold criterion can be set to a higher threshold RBER value. In this way, if the first directional error rate is used for setting the threshold criterion, the memory sub-system controller 115 can decide to perform a scrub of a group of managed units sooner if the first directional error rate meets the lower threshold RBER value than if the second directional error rate, used for the threshold criterion, has not yet met the higher threshold RBER value. Thus, the memory sub-system controller 115 can provide a preference to scrubbing SMUs in which the first directional bit error rate reaches the lower threshold RBER value. In some embodiments, this lower threshold criterion (for $RBER_{01}$) can be used as a first criterion while the higher threshold criterion (for $RBER_{10}$) can be concurrently used as a second criterion.

The directional error rate can be caused by different disturb and drift behavior. For example, the first directional error rate (or $RBER_{01}$) can be caused by a write disturb, while the second directional error rate (or RBER10) can be caused by long delays. Therefore, different scrubbing criteria can be applied to each directional error rate for more accurate scrubbing.

Figure 3:
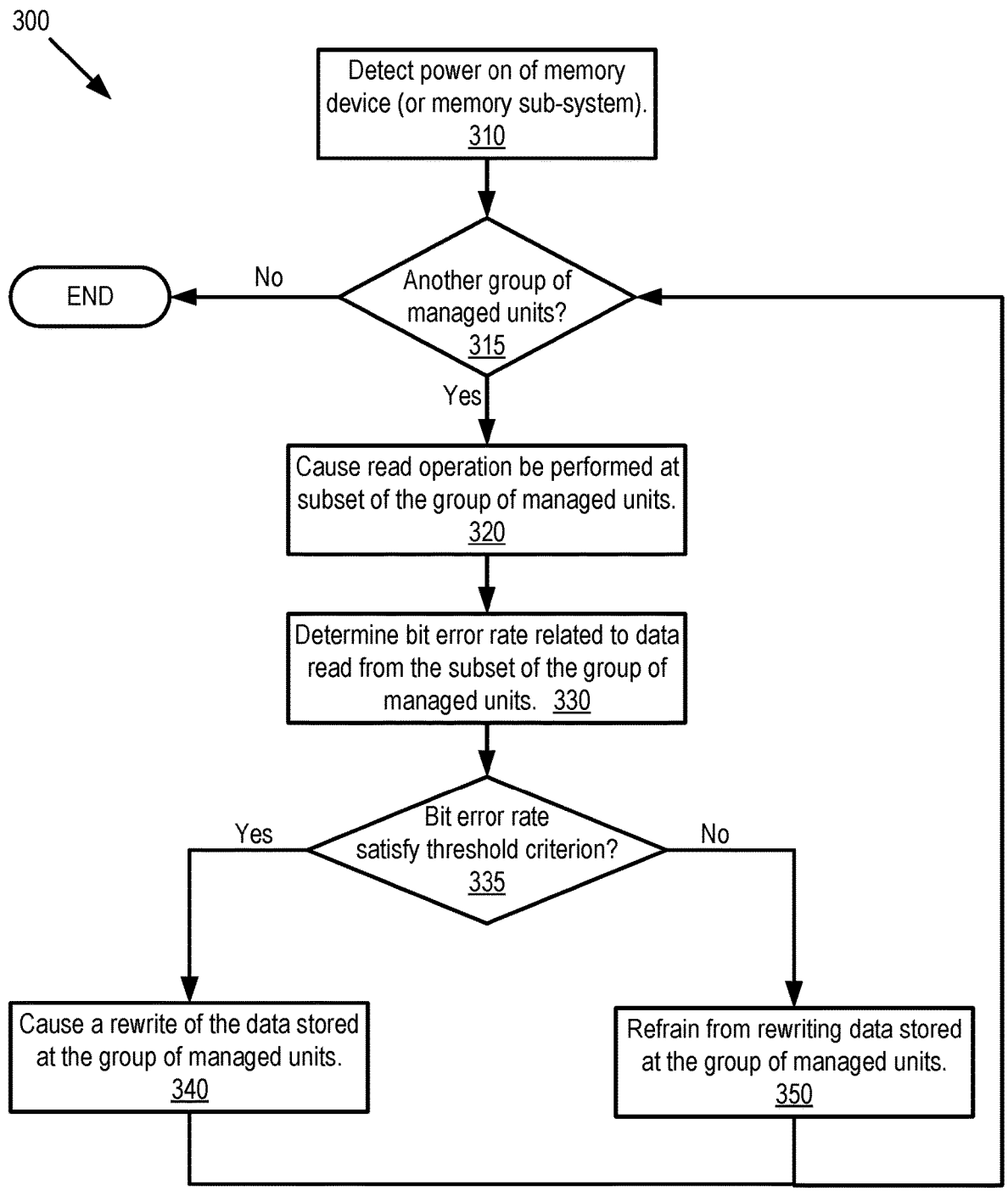
FIG. 3 a flow diagram of an example method for performing a selective power-on scrub of memory units in accordance with some embodiments.

FIG. 3 a flow diagram of an example method 300 for performing a selective power-on scrub of memory units in accordance with some embodiments. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the power-on scrubber 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic detects a power on of a memory device, such as the memory device 130, or of the memory sub-system 110.

At operation 315, the processing logic determines whether another group of managed units (SMU) still exists that has not been processed for the selective power-on scrub of the memory device. If there is no additional group of managed units that need be processed, the method 300 ends. Otherwise, the method 300 continues on to operation 320 with processing the next group of managed units (or SMU).

At operation 320, the processing logic causes a read operation to be performed at a subset of the group of manage units. The subset of the group of managed units can be, for example, a small sampling of managed units such as five percent (or ten percent) of the managed units that make up the group of managed units. As previously discussed, the operations can include randomly generating addresses corresponding to each manage unit of the subset of the group of managed units.

At operation 330, the processing logic determines a bit error rate (e.g., RBER) related to data read from the subset of the group of managed units. In at least one embodiment, the bit error rate is a directional bit error rate, which is directed in a particular threshold voltage direction in three-dimensional (3D) cross-point memory cells of the group of managed units. In one embodiment, the directional bit error rate is a rate of read errors (e.g., RBER) resulting from an incorrectly determined state compared to a programmed state that transitions between two opposing logical states, as was discussed in more detail previously.

At operation 335, the processing logic determines whether the bit error rate satisfies a threshold criterion. For example, the threshold criterion can be at least meeting a threshold value for a certain read bit error rate or a directional bit error rate, e.g., in 3D cross-point memory cells of the group of managed units. In some embodiments, the threshold criterion can be a subset of an error correction code (ECC) correction capability of the data stored in the group of managed units that is being processed. For example, in some embodiments, the threshold criterion can be between 20 and 50 percent, between 30 and 50 percent, between 40 and 50 percent, or some other percentage range of the ECC correction capability.

If, at operation 335, the bit error rate satisfies the threshold criterion, at operation 340, the processing logic causes a rewrite of the data stored at the group of managed units, e.g., at each managed unit of the group of managed units. If, at operation 335, the bit error rate does not satisfy the threshold criterion, at operation 350, the processing logic refrains from rewriting data stored at the group of managed units. In one embodiment, to "refrain from" is to "not perform" the re-write on a particular SMU.

For example, the processing logic can cause a read operation to be performed at a second subset of a second group of managed units, e.g. during another time through the operations 315 through 335. The processing logic can further determine a second bit error rate related to data read from the second subset of the second group of managed units. The processing logic can further, in response to the second bit error rate not satisfying the threshold criterion, refrain from rewriting data stored at the second group of managed units.

In the embodiments of FIG. 3, the method 300 can be iterated through for each group of managed units (e.g., each SMU) of the memory device 130 until there is no additional group of managed units to be processed, as determined at operation 315. If there is no additional group of managed units, the method 300 can end.

Figure 4:
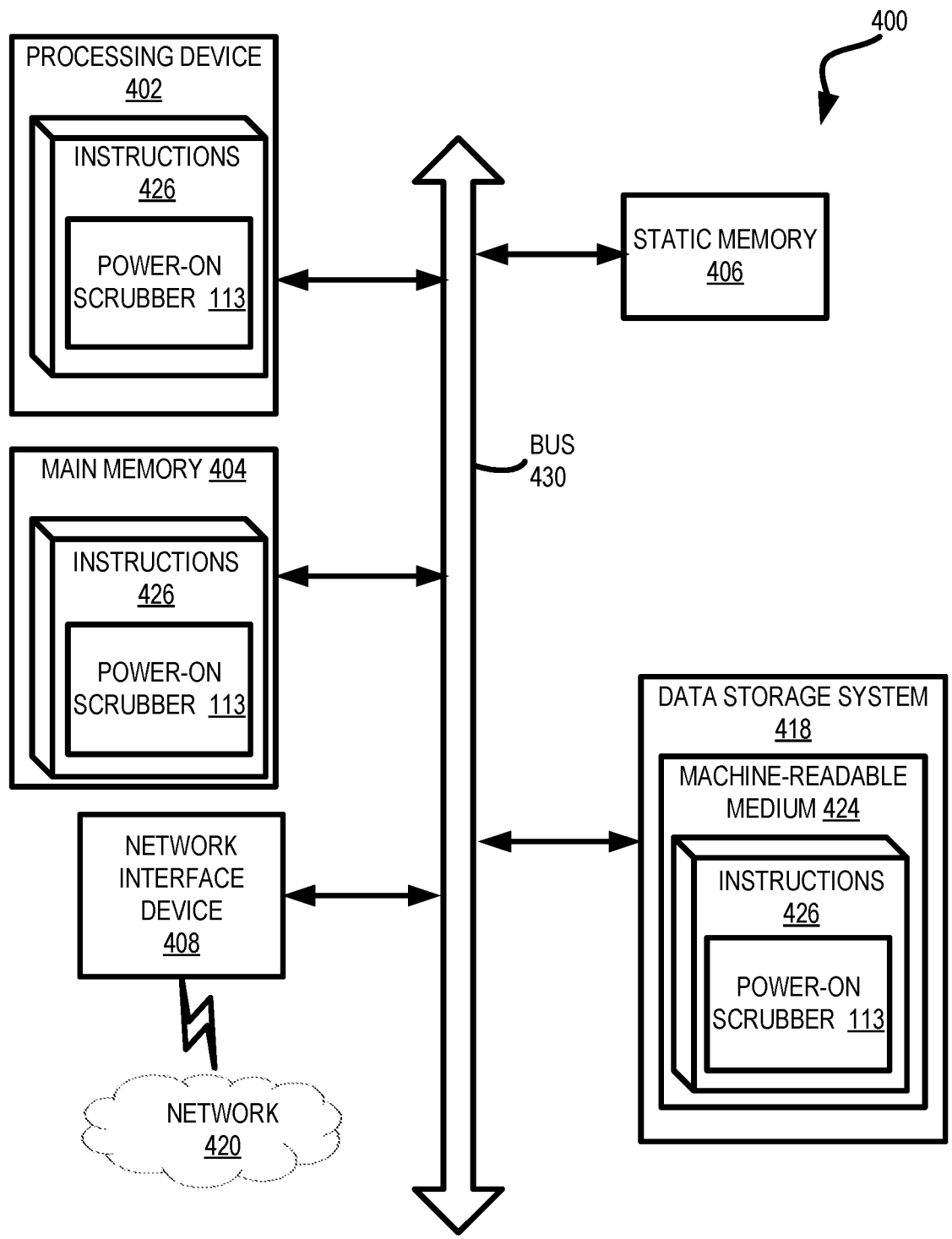
FIG. 4 is a block diagram of an example computer system in which embodiments of the present disclosure can operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the power-on scrubber 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or RDRAM, etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a non-transitory computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a read and write voltage managing component (e.g., the power-on scrubber 113 of FIG. 1A). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of groups of managed units; and
a processing device operatively coupled to the memory device, the processing device to, during power on of the memory device, perform operations comprising:
determining a subset of a group of managed units by one of randomly or pseudo-randomly sampling managed units of the group of managed units;
causing a read operation to be performed at the subset of the group of managed units;
determining a bit error rate related to data read from the subset of the group of managed units; and
in response to the bit error rate satisfying a threshold criterion, causing a rewrite of the data stored at the group of managed units.

2. The system of claim 1, wherein the group of managed units comprises one or more physical blocks that are managed together, and wherein each managed unit comprises one or more pages that are transferred or programmed together.

3. The system of claim 1, wherein the subset of the group of managed units comprises a sampling of managed units of the group of managed units, and wherein the operations are performed for each group of the plurality of groups of managed units.

4. The system of claim 1, wherein the operations comprise:
 causing a read operation to be performed at a second subset of a second group of managed units;
 determining a second bit error rate related to data read from the second subset of the second group of managed units; and
 in response to the second bit error rate not satisfying the threshold criterion, refraining from rewriting data stored at the second group of managed units.

5. The system of claim 1, wherein the threshold criterion for the bit error rate is a subset of an error correction code (ECC) correction capability for correcting the data.

6. The system of claim 1, wherein the bit error rate is a directional bit error rate in three-dimensional (3D) cross-point memory cells of the group of managed units.

7. The system of claim 6, wherein the directional bit error rate is a rate of read errors resulting from an incorrectly determined state compared to a programmed state that transitions between two opposing logical states.

8. A method comprising:
 detecting, by a processing device operatively coupled with a memory device, a power on of the memory device, wherein the memory device comprises a plurality of groups of managed units; and
 in response to detecting the power on of the memory device:
  determining a subset of a group of managed units by one of randomly or pseudo-randomly sampling managed units of the group of managed units;
  causing, by the processing device, a read operation to be performed at the subset of the group of managed units;
  determining, by the processing device, a bit error rate related to data read from the subset of the group of managed units; and
  in response to the bit error rate satisfying a threshold criterion, causing, by the processing device, a rewrite of the data stored at the group of managed units.

9. The method of claim 8, wherein the group of managed units comprises one or more physical blocks that are managed together, and wherein each managed unit comprises one or more pages that are transferred or programmed together.

10. The method of claim 8, wherein the subset of the group of managed units comprises a sampling of managed units of the group of managed units, and wherein, in response to detecting the power on of the memory device, the method further comprises, for each group of managed units:
 causing a read operation to be performed at a subset of the group of managed units;
 determining a bit error rate related to data read from the subset of the group of managed units; and
 in response to the bit error rate satisfying a threshold criterion, causing a rewrite of the data stored at the group of managed units.

11. The method of claim 8, further comprising:
 causing a read operation to be performed at a second subset of a second group of managed units;
 determining a second bit error rate related to data read from the second subset of the second group of managed units; and
 in response to the second bit error rate not satisfying the threshold criterion, refraining from rewriting data stored at the second group of managed units.

12. The method of claim 8, wherein the threshold criterion for the bit error rate is a subset of an error correction code (ECC) correction capability for correcting the data.

13. The method of claim 8, wherein the bit error rate is a directional bit error rate in three-dimensional (3D) cross-point memory cells of the group of managed units.

14. The method of claim 13, wherein the directional bit error rate is a rate of read errors resulting from an incorrectly determined state compared to a programmed state that transitions between two opposing logical states.

15. A non-transitory computer-readable medium storing instructions, which when executed by a processing device that is operatively coupled with a memory device, performing a plurality of operations comprising:
 detecting a power on of the memory device, wherein the memory device comprises a plurality of groups of managed units; and
 in response to detecting the power on of the memory device and for each group of the plurality of groups of managed units:
  determining a subset of a group of managed units by one of randomly or pseudo-randomly sampling managed units of the group of managed units;
  causing a read operation to be performed at the subset of the group of managed units;
  determining a bit error rate related to data read from the subset of the group of managed units; and
  in response to the bit error rate satisfying a threshold criterion, causing a rewrite of the data stored at the group of managed units.

16. The non-transitory computer-readable medium of claim 15, wherein the plurality of operations further comprise:
 causing a read operation to be performed at a second subset of a second group of managed units;
 determining a second bit error rate related to data read from the second subset of the second group of managed units; and
 in response to the second bit error rate not satisfying the threshold criterion, refraining from rewriting data stored at the second group of managed units.

17. The non-transitory computer-readable medium of claim 15, wherein the bit error rate is a directional bit error rate in three-dimensional (3D) cross-point memory cells of the group of managed units, and wherein the directional bit error rate is a rate of read errors resulting from an incorrectly determined state compared to a programmed state that transitions between two opposing logical states.

\* \* \* \* \*